United States Patent
Park et al.

(10) Patent No.: US 7,439,772 B2
(45) Date of Patent: Oct. 21, 2008

(54) LEVEL SHIFTING CIRCUIT AND METHOD REDUCING LEAKAGE CURRENT

(75) Inventors: Chul-Woo Park, Gyeonggi-do (KR); Kyu-Hyoun Kim, Gyeonggi-do (KR); Beom-Sig Cho, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 128 days.

(21) Appl. No.: 11/154,725

(22) Filed: Jun. 15, 2005

(65) Prior Publication Data
US 2006/0055424 A1    Mar. 16, 2006

(30) Foreign Application Priority Data
Sep. 10, 2004    (KR)    ............ 10-2004-0072470

(51) Int. Cl.
*H03K 19/0175*    (2006.01)
(52) U.S. Cl. .................................. 326/81; 326/68
(58) Field of Classification Search ............ 326/80–81, 326/83, 68
See application file for complete search history.

(56) References Cited

U.S. PATENT DOCUMENTS

| | | | |
|---|---|---|---|
| 5,317,213 A * | 5/1994 | Sato et al. ............. | 326/63 |
| 6,768,367 B1 * | 7/2004 | Meadows et al. ........ | 327/333 |
| 6,903,576 B2 * | 6/2005 | Narwal .................. | 326/68 |
| 2002/0113616 A1 | 8/2002 | Shimazaki et al. | |
| 2002/0159302 A1 * | 10/2002 | Helmut et al. ......... | 365/189.12 |

FOREIGN PATENT DOCUMENTS

| JP | 08-335126 | 12/1996 |
|---|---|---|
| JP | 2003-258621 | 9/2003 |
| KR | 1999-0057767 | 7/1999 |

OTHER PUBLICATIONS

English language abstract of the Japanese Publication No. 08-335126, Dec. 17, 1996.
English language abstract of the Japanese Publication No. 2003-258621, Sep. 12, 2003.
English language abstract of Korean Publication No. 1999-0057767, Jul. 15, 1997.

* cited by examiner

*Primary Examiner*—James H Cho
(74) *Attorney, Agent, or Firm*—Marger Johnson & McCollom, P.C.

(57) ABSTRACT

A level shifting circuit and method that reduce leakage current are provided. The level shifting circuit includes: a logic circuit including a plurality of MOSFETs (metal-oxide-semiconductor field effect transistors) connected in series between an output terminal and a source, receiving an input signal having a first logic level and a second logic level, changing the input signal to a signal having a first logic level and a third logic level in response to a feedback signal supplied to one of the MOSFETs, and outputting the changed signal as an output signal; and a feedback circuit generating the feedback signal in response to the output signal.

15 Claims, 6 Drawing Sheets

LEVEL SHIFTING CIRCUIT AND METHOD REDUCING LEAKAGE CURRENT

BACKGROUND

This application claims the priority of Korean Patent Application No. 10-2004-0072470, filed on Sep. 10, 2004, in the Korean Intellectual Property Office. The entire content of Korean Patent Application No. 10-2004-0072470, filed on Sep. 10, 2004 is hereby incorporated herein by reference.

1. Field

The present application relates to electronic circuitry and more particularly to level shifting circuitry.

2. Background Discussion

Level shifting circuitry is commonly used in semiconductor integrated circuits to transfer signals between two logic circuits having different operating voltages. FIG. 1 is a circuit diagram of a simple level shifting circuit 120 that changes the signal level between logic circuit 110 and logic circuit 130. Logic circuits 110 and 130 have different operating voltages. Referring to FIG. 1, the first logic circuit 110 operates at a voltage levels VCC and VSS1. Level VCC is a logic high level and level VSS1 is a logic low level. The second logic circuit 130 operates at voltage levels VCC and VSS2. In circuit 130, voltage level VCC is a logic high level and voltage level VSS2 is a logic low level. The level shifting circuit 120 receives an output signal from the first logic circuit 110, changes the level of the received signal, and transfers the changed signal to the second logic circuit 130. The logic high voltage level of logic circuits 110 and 130 is VCC and the logic low levels of logic circuits 110 and 130 are VSS1 and VSS2, respectively.

The level shifting circuit 120 operates as an inverter. Circuit 120 includes a P-type metal-oxide-semiconductor field effect transistor (MOSFET) P1, and an N-type MOSFET N1. The level shifting circuit 120 changes the level of the signal output from the first logic circuit 110 from VCC to VSS2, or from VSS1 to VCC and sends the changed signals to the second logic circuit 130.

When the level of a signal input to the level shifting circuit 120 is VSS1, the voltage VSS1 is applied to a gate terminal of the N-type MOSFET N1, and the voltage between the gate and source of the N-type MOSFET N1 is VSS1-VSS2. When VSS1-VSS2 is less than a threshold voltage of the N-type MOSFET N1, the N-type MOSFET N1 is not turned on. However, leakages occur due to a sub-threshold current in the N-type MOSFET N1, and hence power may be wasted. Such leakage current can be reduced to a few amps or less by implanting ions into a channel of the N-type MOSFET N1 to raise the threshold voltage. However, in order to implant ions into a channel, an additional ion-implanting process step is necessary. Further, an additional mask is required for the ion-implanting process. Thus, the cost of production is increased. Also, it is difficult to optimize a design for controlling the threshold voltage of the N-type MOSFET N1. Finally, the reliability of such circuitry is not particularly high.

Leakage current can be reduced by using the level shifting circuit 220 shown in FIG. 2. Circuit 220 changes signal level between two logic circuits 210 and 220 that have different operating voltages.

The level shifting circuit 220 shown in FIG. 2 changes the level of the signal output from the first logic circuit 210 from VCC to VSS2 and from VSS1 to VCC. The level shifting circuit 220 has a cross-coupled latch structure including P-type MOSFETs P2 and P3 and N-type MOSFETs N2 and N3.

When the level of the signal applied to the gate of the P-type MOSFET P2 is VSS1, the N-type MOSFET N3 is turned on and the voltage level VSS2 is applied to a gate terminal of the N-type MOSFET N2. In like manner, when the level of the signal at the input P-type MOSFET P3 is VSS1, the voltage level VSS2 is applied to a gate terminal of the N-type MOSFET N3.

In the level shifting circuit 220, the voltage between the gate and source of each of the N-type MOSFETs N2 and N3 is constant at zero volts, and therefore the leakage current is reduced. However, since the voltage is applied to the gate of the N-type MOSFET N2 or N3 through the P-type MOSFET P2 or P3, during the time period in which the voltage of the gate of the N-type MOSFET N2 or N3 goes from VCC to VSS2, a transient current may flow between the P-type MOSFETs P2 and P3 and in the N-type MOSFETs N2 and N3. The larger the difference between VSS1 and VSS2, the larger the transient current.

SUMMARY

The circuit described herein is a level shifting circuit capable of reducing leakage current without the use of an additional ion-implanting process during manufacturing. Also described herein is a level shifting method capable of reducing leakage current.

The level shifting circuits described herein include a plurality of metal-oxide-semiconductor field effect transistors (MOSFETs) connected in series between an output terminal and a voltage source. One of the MOSFETs is controlled by the input signal and one of the MOSFETs is controlled by a feedback signal. The feedback signal is generated in response to the output signal.

A method for shifting the level of voltages is also described. In the method of shifting voltages a plurality of MOSFETs connected in series between an output terminal and a source. One of the MOSFETs is controlled by an input signal and a second MOSFET is controlled by a feedback voltage. The feedback signal is generated in response to the output signal.

Several different embodiments of the invention are specifically described herein; however, those skilled in the art will understand that many other similar embodiments are possible.

DETAILED DESCRIPTION

Figure 1:
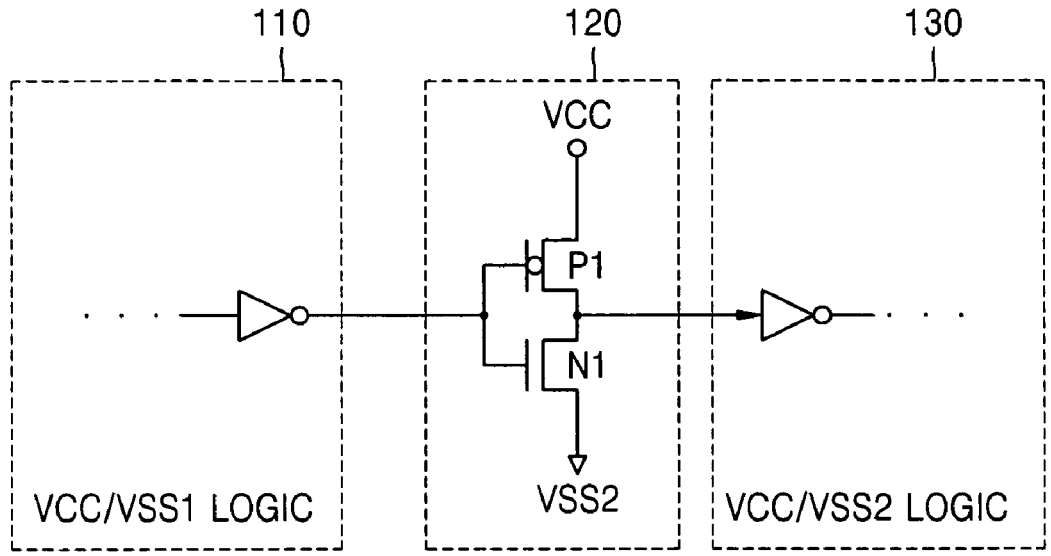
FIG. 1 is a circuit diagram of a prior art level shifting circuit for changing a signal level between two logic circuits having different operating voltages.
Figure 2:
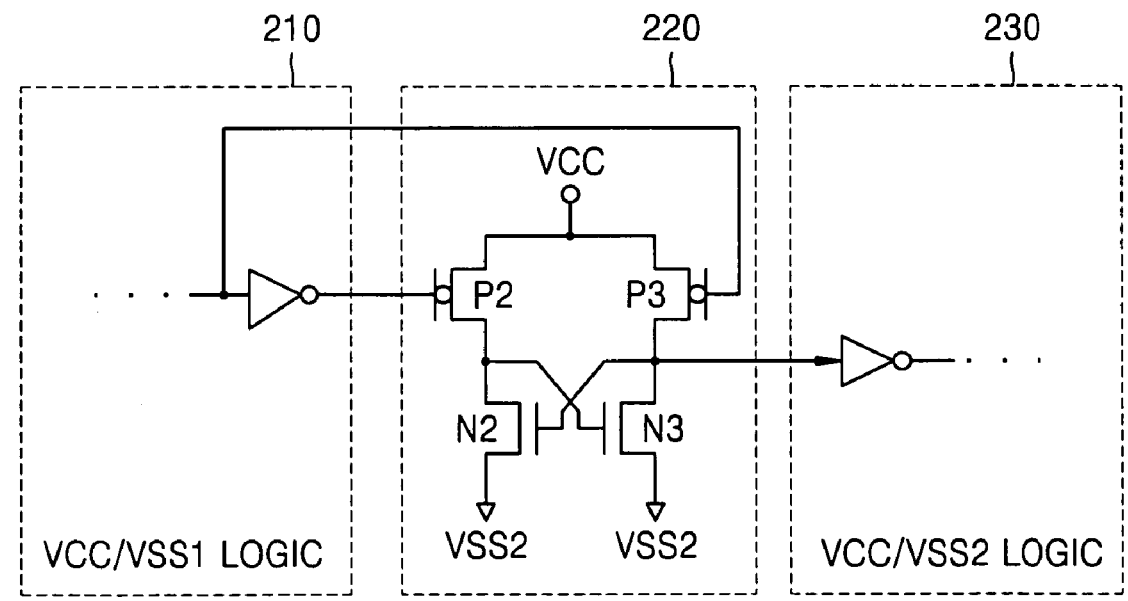
FIG. 2 is a circuit diagram of another prior art level shifting circuit for changing a signal level between two logic circuits having different operating voltages.

The attached drawings illustrate various embodiments of the present invention. Hereinafter, these embodiments will be described in detail with reference to the attached drawings. Like reference numerals in the drawings denote like elements.

Figure 3:
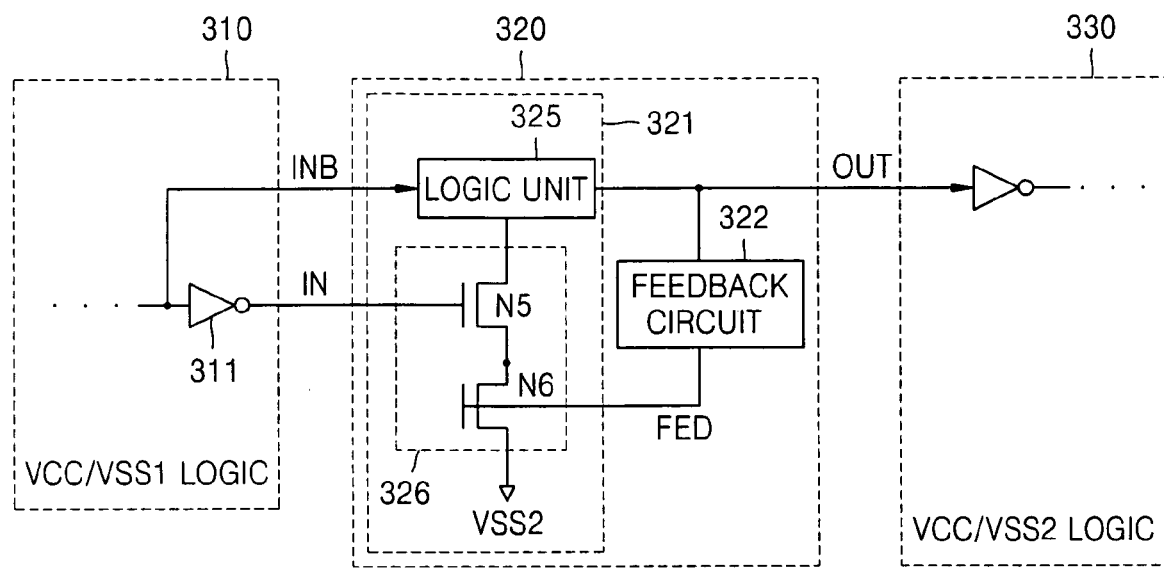
FIG. 3 is a circuit diagram of a level shifting circuit for changing a signal level between two logic circuits having different operating voltages according to an exemplary first embodiment of the present invention.

A first embodiment is shown in FIG. 3. In this embodiment, a level shifting circuit 320 is connected between two logic circuits 310 and 330. The circuits 310 and 330 have different operating voltages. Level shifting circuit 320 changes the signal levels as signals are transmitted between the first logic circuit 310 and the second logic circuit 330.

The first logic circuit 310 operates at a logic high level VCC and a logic low level VSS1. The second logic circuit 330 operates at a logic high level VCC and a logic low level VSS2. The level shifting circuit 320 changes the level of the output from the first logic circuit 310 from VCC to VSS2 and from VSS1 to VCC. The changed levels are transferred to the second logic circuit 330.

It is noted that in this first embodiment (and in certain of the other embodiments shown herein) the logic low levels in circuit 310 and circuit 330 are different. The logic high level of both circuits is the same. However, in other embodiments the logic high levels of the two logic circuits 310 and 320 may be different, or both the logic high levels and the logic low levels may be different. Such embodiments are only slightly different from the level shifting circuits described herein and the differences will be easily understood by those skilled in the art.

Referring to FIG. 3, the level shifting circuit 320 includes a logic circuit 321 and a feedback circuit 322. The logic circuit 321 includes MOSFETs N5 and N6 (which are collectively referred to as a circuit 326) and a logic unit 325. The MOSFETs N5 and N6 are connected in series between a VSS2 voltage source and the logic unit 325. The feedback circuit 322 generates a feedback signal FED based on the output signal OUT.

The logic circuit 321 receives a first signal IN which has values of VCC and VSS1. Logic circuit 321 also receives a second input signal INB which is the inverse of the first signal IN. The first input signal IN is changed from VCC and VSS1 to VSS2 and VCC by using the feedback signal FED applied to one of the MOSFETs in the circuit 326. When the logic circuit 321 receives the signals IN and INB, the logic circuit 321 generates the output signal OUT. The signal OUT is generated converting the signal IN to a signal with voltage levels VCC and VSS2.

As shown in FIG. 3, the signal at the input to the buffering inverter 311 in circuit 310 is used as the second signal INB. Alternatively, an inverter can be included in the logic unit 325 to invert the first signal IN and thereby produce the signal INB.

Figure 4:
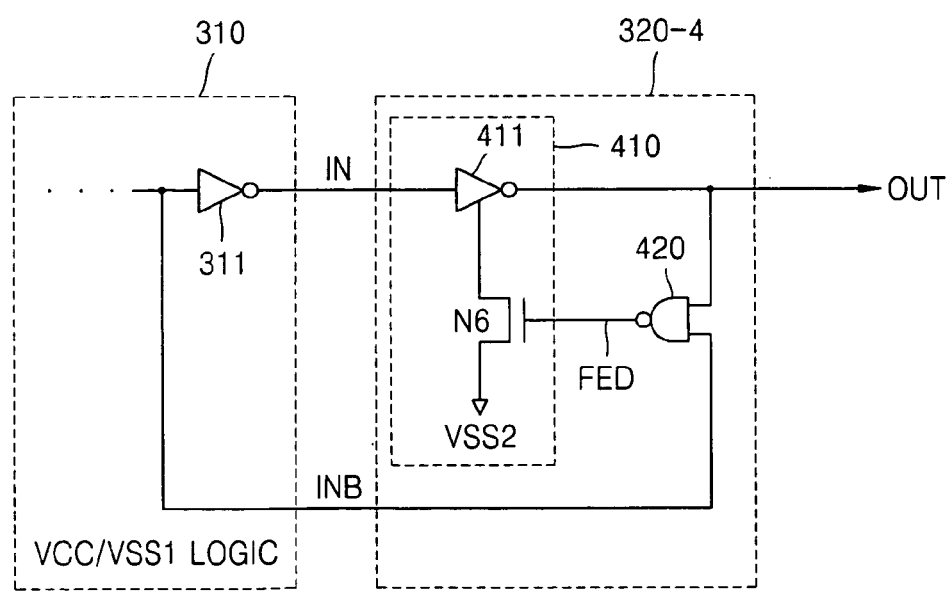
FIG. 4 is a circuit diagram of the first logic circuit and the level shifting circuit of FIG. 3 according to an embodiment of the present invention.
Figure 5:
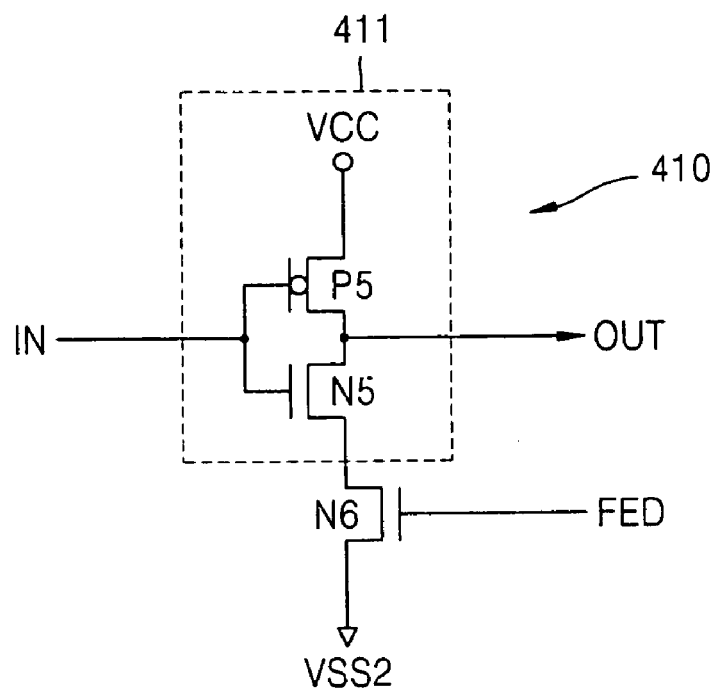
FIG. 5 is a circuit diagram of a general inverter shown in FIG. 4.

A second embodiment is shown in FIGS. 4 and 5. As shown in FIG. 4, a level shifting circuit 320-4 includes a logic circuit 410 and a NAND circuit 420. The NAND circuit 420 forms a part of a feedback path. The INB signal forms one input to the NAND circuit 420 and the OUT signal is the second input.

The logic circuit 410 (which performs a function similar to circuit 321 in FIG. 3) includes an inverter 411 and an N-type MOSFET transistor N6. The inverter 411 includes a P-type MOSFET transistor P5 and an N-type MOSFET transistor N5 as shown in FIG. 5. The N-type MOSFET N6 is connected in series with the source terminal of the N-type MOSFET N5. The logic circuit 410 therefore includes in a series connection P-type MOSFET P5, N-type MOSFET N5, and N-type MOSFET N6. The three MOSFETs P5, N5 and N6, are connected in series between a VCC source and a VSS2 source.

As shown in FIG. 5, the gate terminals of the first P-type MOSFET P5 and the N-type MOSFET N5 receive the input signal IN, and the gate terminal of the N-type MOSFET N6 receives the feedback signal FED. The output signal OUT is generated by the inverter 411 which includes the P-type MOSFET P5 and the N-type MOSFET N5. The feedback path includes NAND circuit 420. It is noted that a NAND circuit is a (Not AND) logic block. NAND logic circuit 420 receives the output signal OUT and the signal INB as inputs and it generates the feedback signal FED. The NAND circuit 420 operates at voltages of VCC and VSS2, and thus it outputs a signal at VCC and VSS2 voltage levels.

When the level of the first signal IN changes from VCC to VSS1, the level of the output signal OUT goes to VCC because the P-type MOSFET P5 is turned on, and the N-type MOSFET N5 is turned off. The reason for this is that the voltage between the gate and the source of the N-type MOSFET N5 is less than VSS1. Further, since the gate voltage of the third N-type MOSFET N6 is VSS2, due to a NAND logic operation of the feedback circuit 420, the third N-type MOSFET N6 is turned off. Hence, because both the N-type MOSFETs N5 and N6 are turned off, there is little leakage current flowing between the VCC source and the VSS2 source during the transition of the gate of the third N-type MOSFET N6 from VCC to VSS2. The voltage levels and components in circuit 320 should be chosen so that the voltage VSS1-VSS2 should be smaller than the threshold voltage of the N-type MOSFETs N5 and N6.

Figure 6:
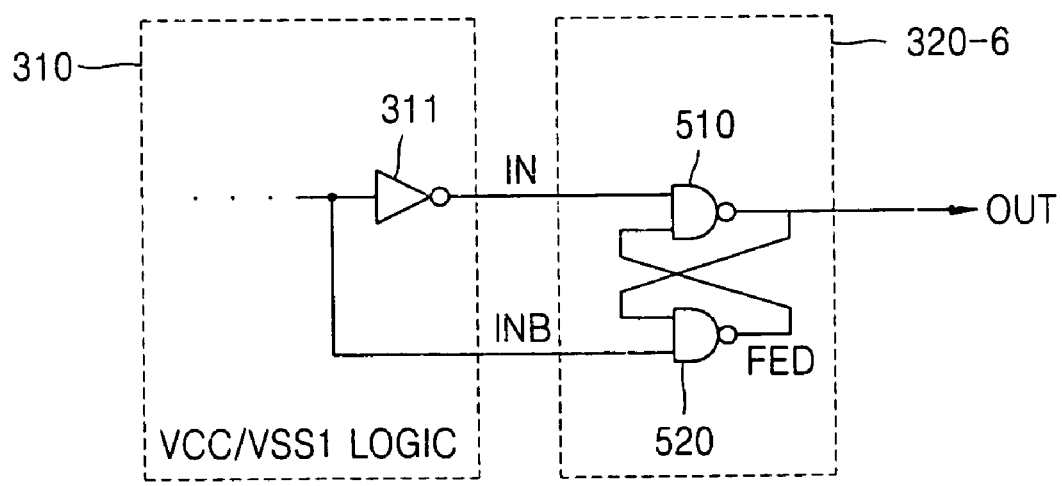
FIG. 6 is a circuit diagram of the first logic circuit and the level shifting circuit of FIG. 3 according to another embodiment of the present invention.

A third embodiment is shown in FIG. 6. FIG. 6 shows the first logic circuit 310 and a level shifting circuit 320-6. An output signal OUT from circuit 320-6 goes to a second logic circuit (not shown in the Figure). Circuit 320-6 is a modification of the circuit 320 shown in FIG. 4. The level shifting circuit 320-6 includes NAND logic circuits 510 and 520. The logic circuit 510 performs a NAND logic operation on the input first signal IN and the feedback signal FED to generate the output signal OUT. The OUT signal also serves as a feedback signal to the circuit 520. The logic circuits 510 and 520 are NAND logic circuits, which operate at voltages VCC and VSS2, respectively. The logic and feedback circuits 510 and 520 output signals at VCC and VSS2. The level shifting circuit 320-6 includes a P-type MOSFET and N-type MOSFETs connected as shown in FIG. 4 and leakage current is reduced as in the level shifting circuit shown in FIG. 4.

Figure 7:
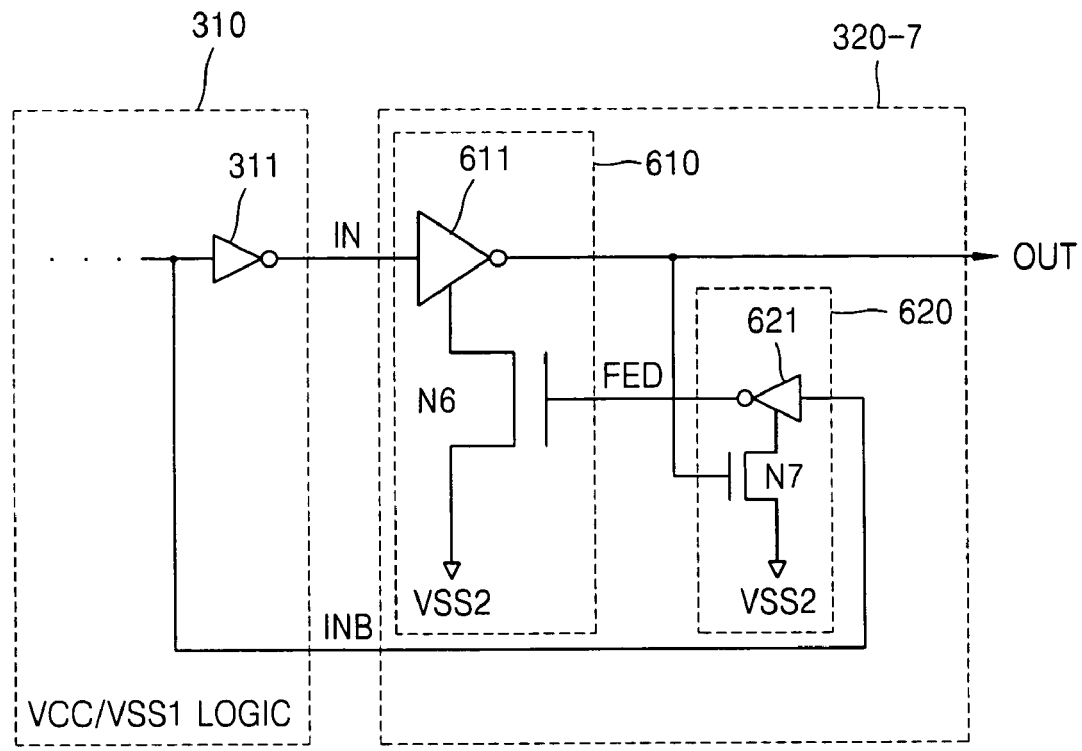
FIG. 7 is a circuit diagram of the first logic circuit and the level shifting circuit of FIG. 3 according to another embodiment of the present invention.

A fourth embodiment of the invention is shown in FIG. 7. FIG. 7 shows the first logic circuit 310 and the level shifting circuit 320-7. The level shifting circuit 320-7 generates an output signal OUT that goes to a second logical circuit (not shown in the drawing). Similar to the logic circuit 321 of FIG.

4, a logic circuit 610 of FIG. 7 includes an N-type MOSFET N6 connected in series with a source terminal of an N-type MOSFET that is in inverter 611. The feedback circuit 620 shown in FIG. 7 includes an N-type MOSFET N7 connected in series to a source terminal of an N-type MOSFET that is in inverter 621.

The inverter 611 receives the input signal IN. The gate terminal of the N-type MOSFET N6 receives the feedback signal FED. The output signal OUT is generated by inverter 611. The inverter 611 includes a P-type MOSFET and an N-type MOSFET (not specifically shown in the drawings).

The feedback circuit 620 receive the second input signal INB. The gate terminal of the N-type MOSFET N7 is connected to the output signal OUT. The inverter 621 includes a P-type MOSFET and an N-type MOSFET (not specifically shown in the Drawing). The feedback signal FED is generated by inverter 621. The sizes of the MOSFETs included in the feedback circuit 620 can be smaller than the sizes of the corresponding MOSFETs included in the logic circuit 610.

The logic circuit 610 has a configuration similar to the logic circuit 321 shown in FIG. 5 and it includes two N-type MOSFETs connected in series to a VSS2 source. Therefore, the logic circuit 610 operates stably and a leakage current is not generated during transition of the gate of the N-type MOSFET N6 from VCC to VSS2.

Figure 8:
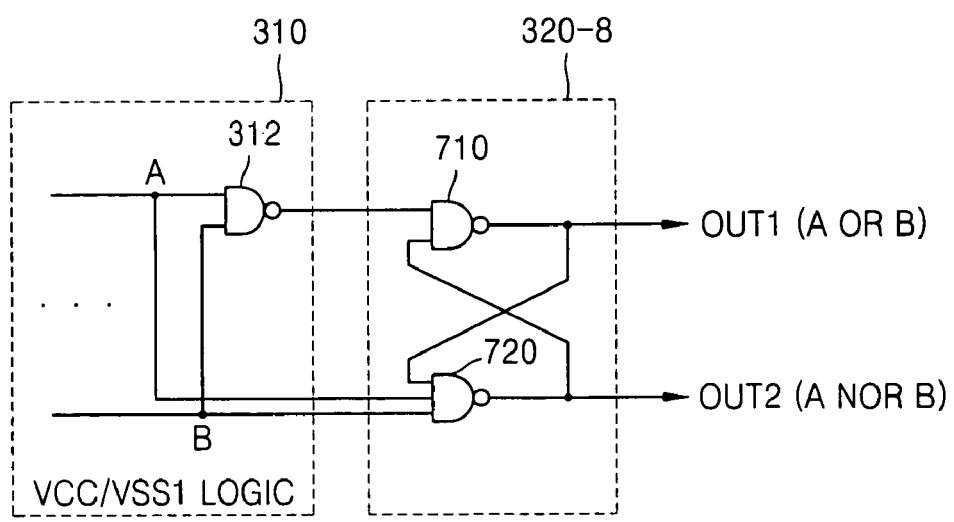
FIG. 8 is a circuit diagram of the first logic circuit and the level shifting circuit of FIG. 3 according to another embodiment of the present invention.

A fifth embodiment is shown in FIG. 8. As illustrated in FIG. 8, the embodiment includes a first logic circuit 310 and the level shifting circuit 320-8. Two output signals OUT1 and OUT2 are generated by the circuit 320-8. The level shifting circuit 320-8 of FIG. 8 is a modification of the level shifting circuit 320-6 shown in FIG. 6. Level shifting circuit 320-8 receives signals A and B from the first logic circuit 310 in addition to an output from the NAND logic circuit 312. Circuit 320-8 performs level-shifting to generate a first output signal OUT1 and a second output signal OUT2. The signals A and B and the output of the NAND logic circuit 312 are at voltage levels VCC and VSS1. The logic circuit 710 and a feedback circuit 720 included in the level shifting circuit 320-8 are NAND logic circuits which operate at VCC and VSS2, and therefore the circuits 710 and 720 output signals at VCC and VSS2.

Figure 9:
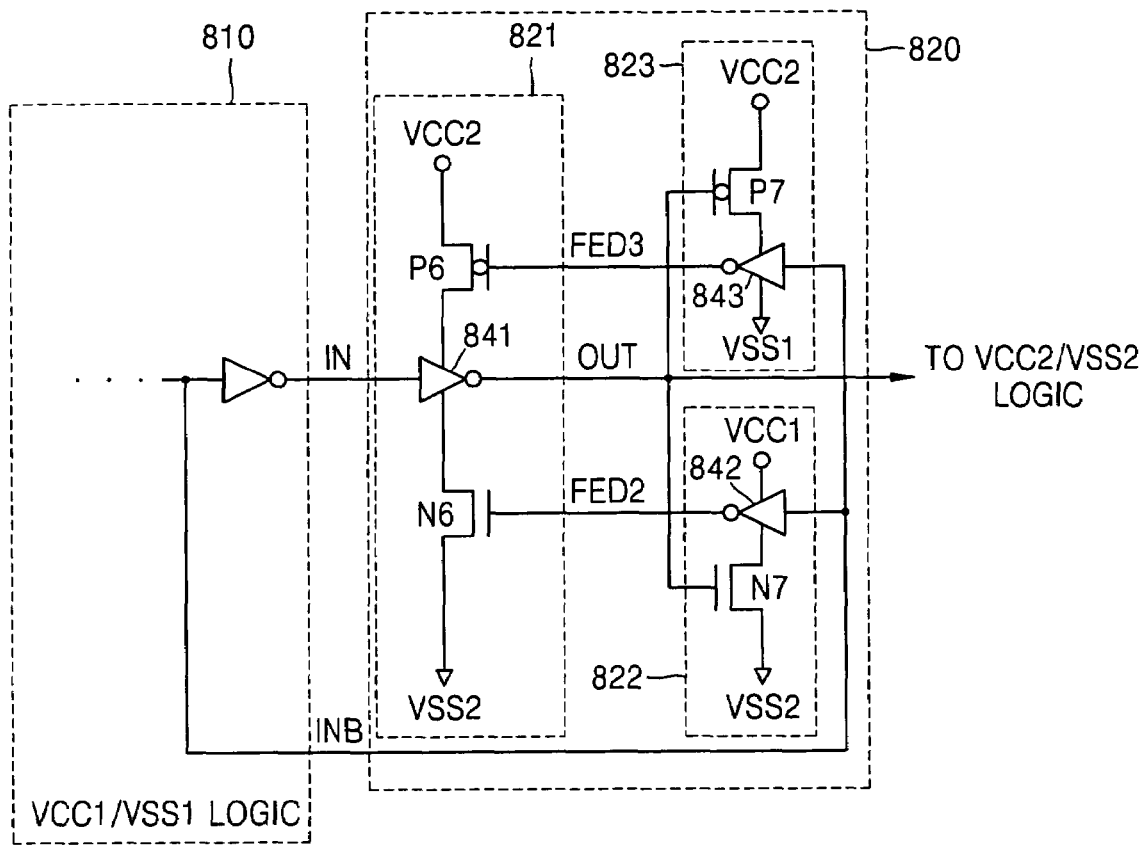
FIG. 9 is a circuit diagram of a level shifting circuit for changing a signal level of a first logic circuit from VCC1/VSS1 to VCC2/VSS2 according to an embodiment of the present invention.
Figure 10:
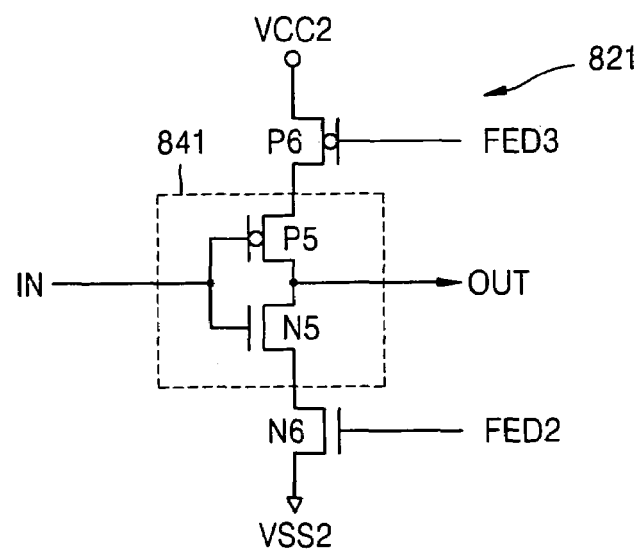
FIG. 10 is a circuit diagram of the logic circuit of FIG. 9.

A sixth embodiment is illustrated in FIGS. 9 and 10. FIG. 9 shows a level shifting circuit 820 for changing a signal level of a first logic circuit 810 from VCC1/VSS1 to VCC2/VSS2. Referring to FIG. 9, the level shifting circuit 820 includes a logic circuit 821, a first feedback circuit 822, and a second feedback circuit 823. FIG. 10 is a detailed circuit diagram of the logic circuit 821 of FIG. 9. The logic circuit 821 includes an N-type MOSFET N6 connected in series to a source terminal of an N-type MOSFET of a general inverter 841, and a P-type MOSFET P6 connected in series to a source terminal of a P-type MOSFET of the inverter 841. Similar to the logic circuit 321 shown in FIG. 5, the configuration of the first feedback circuit 822 includes an N-type MOSFET N7 connected in series to a source terminal of an N-type MOSFET of a general inverter 842. Similarly, the second feedback circuit 823 includes a P-type MOSFET P7 connected in series to a source terminal of a P-type MOSFET of a general inverter 843. The logic circuit 821 operates at an operating voltage of VCC2 and VSS2, the first feedback circuit 822 operates at an operating voltage of VCC1 and VSS2, and the second feedback circuit 823 operates at an operating voltage of VCC2 and VSS1.

Referring to FIG. 10, the logic circuit 821 includes, between a VCC source and a VSS2 source, an N-type MOSFET N5 with a source terminal connected in series to a drain terminal of an N-type MOSFET N6 between an output signal OUT terminal and a VSS2 source, and a P-type second MOSFET P5 with a source terminal connected in series to a drain terminal of a P-type MOSFET P6 between the output signal OUT terminal and a VCC2 source. The gate terminals of the N-type MOSFET N5 and the P-type MOSFET P5 receive a first feedback signal FED2, and the gate terminal of the P-type MOSFET P6 receives a second feedback signal FED3. The output signal OUT is output from a terminal to which drains of the P-type MOSFET P5 and the N-type MOSFET N5 are connected. The first feedback circuit 822 generates the first feedback signal FED2 in response to the output signal OUT. The second feedback circuit 823 generates the second feedback signal FED 3 in response to the output signal OUT. A second signal INB from circuit 810 also contributes to the generation of the first feedback signal FED2 and the second feedback signal FED3.

The logic circuit 821 receives an input signal IN with voltage levels VCC1 and VSS1. The logic circuit 821 changes the input first signal IN into a signal with a voltage of VCC2 and VSS2 using the first feedback signal FED2 supplied to the N-type MOSFET N6 and the second feedback signal FED3 supplied to the P-type MOSFET P6 and outputs the changed signal as the output signal OUT.

Figure 11:
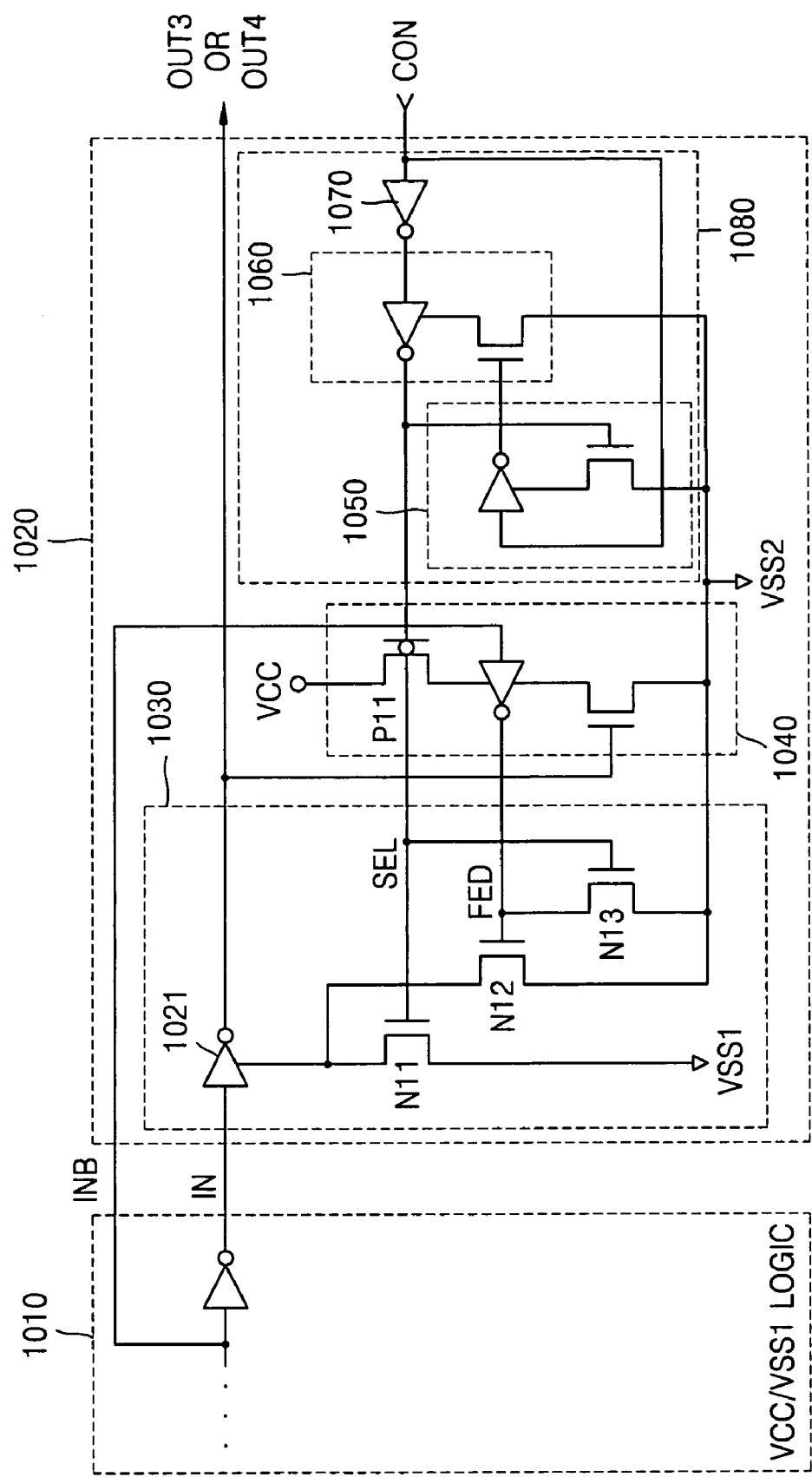
FIG. 11 is a circuit diagram of a level shifting circuit for selectively changing an input signal level to VCC/VSS1 or VCC/VSS2 according to another embodiment of the present invention.

A seventh alternative embodiment is illustrated in FIG. 11. The embodiment shown in FIG. 11 includes a level shifting circuit 1020 for selectively changing an input signal level of a first logic circuit 1010 to VCC/VSS1 or VCC/VSS2. Referring to FIG. 11, the level shifting circuit 1020 includes a logic circuit 1030, a feedback circuit 1040, and a control circuit 1080.

The control circuit 1080 includes an inverter 1070, a first circuit 1060, and a second circuit 1050. Each of the first circuit 1060 and the second circuit 1050 has a configuration similar to the logic circuit of FIG. 5, and performs an operation similar to the operation of the level shifting circuit 320 of FIG. 7. The inverter 1070 operates at VCC and VSS1. The control circuit 1080 receives a level select control signal CON at a level of VCC and VSS1, changes the received level select control signal to a signal at a level of VCC and VSS2, and outputs the changed signal as a select signal SEL.

Referring to FIG. 11, the logic circuit 1030 includes N-type MOSFETs N11 and N12 connected in series to a source terminal of an N-type MOSFET of a general inverter 1021, and the operation of the N-type MOSFET N12 is controlled by an N-type MOSFET N13 controlled by the select signal SEL. That is, when the select signal SEL is at a logic high state, the logic circuit 1030 receives a first signal IN having a level of VCC and VSS1, changes the input first signal IN to a signal which has a voltage of VCC and VSS1 using the select signal SEL, which is supplied to the N-type MOSFET N1 1, which is connected in series between a terminal of the output signal OUT and a VSS1 source, and outputs the changed signal as a first output signal OUT3. When the select signal is at a logic low state, the logic circuit 1030 receives the input first signal IN, which has a voltage of VCC and VSS, changes the input first signal IN to a signal with a voltage of VCC and VSS2 using a feedback signal FED supplied to the N-type MOSFET N12 connected in series between the terminal of the output signal OUT and a VSS2 source, and outputs the changed signal as a second output signal OUT4.

The configuration of the feedback circuit 1040 is identical to the configuration of the logic circuit 821 of FIG. 10. The feedback circuit 1040 generates the feedback signal FED using the second output signal OUT4 when the select signal SEL is at a logic low state. When the select signal SEL is at a logic high state, the P-type MOSFET P11 of the feedback circuit 1040 is turned off, and therefore the feedback circuit 1040 does not generate the feedback signal FED.

As describe above, according to the present invention, a level shifting circuit 320, 320-4, 320-6, 320-7, 320-8, 820 and 1020 includes a logic circuit including two MOSFETs connected in series between an output terminal and a source, and a feedback circuit controls one of the two MOSFETs. Further, as described above, leakage current is reduced in the level shifting circuit without an additional ion-implanting process by turning off the two MOSFETs connected in series between the output terminal and the source.

It is noted that in the description of some of the embodiments and in FIGS. 4, 6, 7, 8, 9, and 11, a first logic circuits 310 is shown and described along with a level shifting circuit. In the above listed figures, a second logic circuit 330 which receives the output of the level shifting circuit is not explicitly shown. It should be understood that in each embodiment, the level shifting circuit can provide signals to a second circuit.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A level shifting circuit comprising:
   a logic circuit including a plurality of metal-oxide-semiconductor field effect transistors (MOSFETs) connected in series between an output terminal and a source,
   said logic circuit adapted to receive an input signal having a first logic level and a second logic level,
   said logic circuit adapted to change the input signal to a signal having the first logic level and a third logic level in response to a feedback signal supplied to one of the MOSFETs, and adapted to output said changed signal as an output signal; and
   a feedback circuit adapted to generate the feedback signal in response to the output signal;
   wherein the logic circuit is adapted to receive the input signal and an inverted input signal, and
   wherein the logic circuit is adapted to use the inverted input signal together with the output signal to generate the feedback signal.

2. The level shifting circuit of claim 1, wherein the logic circuit is adapted to generate the output signal by changing the logic level of the input signal from the first logic level to the third logic level and from the second logic level to the first logic level.

3. The level shifting circuit of claim 1, wherein the logic circuit includes a first MOSFET, a second MOSFET and a third MOSFET having source and drain terminals connected in series between a source of the first logic level and a source of the third logic level,
   gate terminals of the first MOSFET and the second MOSFET connected to receive the input signal, a gate terminal of the third MOSFET connected to receive the feedback signal, and the output signal is output from a terminal to which the first MOSFET and the second MOSFET are connected.

4. The level shifting circuit of claim 1, wherein
   said logic circuit is adapted to generate the output signal by changing the input signal to a signal having the first logic level and the third logic level.

5. The level shifting circuit of claim 4, wherein the feedback circuit is adapted to perform a NAND logic operation on the output signal and the inverted input signal and adapted to output the result as the feedback signal.

6. The level shifting circuit of claim 4, wherein the feedback circuit includes a first MOSFET, a second MOSFET and a third MOSFET having drain terminals connected in series between a source of the first logic level and a source of the third logic level,
   gate terminals of the first MOSFET and the second MOSFET adapted to receive the second signal, a gate terminal of the third MOSFET adapted to receive the output signal, and
   said first MOSFET and the second MOSFET being connected to a terminal and adapted to output the feedback signal from said terminal.

7. The level shifting circuit of claim 4, wherein sizes of the MOSFETs included in the feedback circuit are smaller than and correspond to the MOSFETs included in the logic circuit.

8. A level shifting circuit comprising:
   a logic circuit including a plurality of metal-oxide-semiconductor field effect transistors (MOSFETs) connected in series between an output terminal and a source,
   said logic circuit adapted to receive an input signal having a first logic level and a second logic level,
   said logic circuit adapted to change the input signal to a signal having the first logic level and a third logic level in response to a feedback signal supplied to one of the MOSFETs, and adapted to output said changed signal as an output signal; and
   a feedback circuit adapted to generate said feedback signal in response to the output signal;
   wherein the logic circuit is adapted to perform a NAND logic operation on the input signal and the feedback signal and to output the result as the output signal.

9. A level shifting method comprising:
   receiving an input signal having a first logic level and a second logic level;
   receiving an inverted input signal;
   changing the input signal to a signal having the first logic level and a third logic level in response to a feedback signal supplied to one of a plurality of MOSFETs connected in series between an output terminal and a source;
   outputting the changed signal as an output signal; and
   generating the feedback signal in response to said output signal,
   wherein the feedback signal is generated in response to the inverted input signal and the output signal.

10. The level shifting method of claim 9, wherein the logic level of the input signal is changed from the first logic level to the third logic level, and from the second logic level to the first logic level.

11. The level shifting method of claim 9, wherein the output signal is the result of a NAND logic operation on the input signal and the feedback signal.

12. The level shifting method of claim 9, wherein the output signal is generated by changing the input signal to a signal having the first logic level and the third logic level.

13. The level shifting method of claim 12, wherein the feedback signal is the result of a NAND logic operation on the output signal and the inverted input signal.

14. The level shifting method of claim 12, wherein by using a circuit including a first MOSFET, a second MOSFET and a third MOSFET having source and drain terminals connected in series between a source of the first logic level and a source of the third logic level,
   gate terminals of the first MPSFET and the second MOSFET receive the inverted input signal, a gate terminal of the third MOSFET receives the output signal, and the feedback signal is output from a terminal to which the first MOSFET and the second MOSFET are connected.

15. A level shifting method comprising:

receiving an input signal having a first logic level and a second logic level;

receiving an inverted input signal;

changing the input signal to a signal having the first logic level and a third logic level in response to a feedback signal supplied to one of a plurality of MOSFETs connected in series between an output terminal and a source;

outputting the changed signal as an output signal; and generating said feedback signal in response to said output signal;

wherein by using a circuit including a first MOSFET, a second MOSFET and a third MOSFET having source and drain terminals are connected between a source of the first logic level and a source of the third logic level, gate terminals of the first MOSFET and the second MOSFET receive the input signal, a gate terminal of the third MOSFET receives the feedback signal, and the output signal is output from a terminal to which the first MOSFET and the second MOSFET are connected.

* * * * *

UNITED STATES PATENT AND TRADEMARK OFFICE
CERTIFICATE OF CORRECTION

PATENT NO. : 7,439,772 B2 Page 1 of 1
APPLICATION NO. : 11/154725
DATED : October 21, 2008
INVENTOR(S) : Chul-Woo Park et al.

It is certified that error appears in the above-identified patent and that said Letters Patent is hereby corrected as shown below:

Column 6, line 51, the words "N1 1," should read -- N11, --.

Signed and Sealed this

Sixteenth Day of December, 2008

JON W. DUDAS
*Director of the United States Patent and Trademark Office*